United States Patent [19]

Tai

[11] Patent Number: 5,491,111
[45] Date of Patent: Feb. 13, 1996

[54] METHOD OF MAKING A SEMICONDUCTOR DIODE

[76] Inventor: George Tai, 14th Fl., No. 133, Sec. 1, Pei Hsin Rd., Hsin Tien City, Taipei Hsien, Taiwan

[21] Appl. No.: 330,064

[22] Filed: Oct. 26, 1994

[51] Int. Cl.[6] .................................................. H01L 21/60
[52] U.S. Cl. ........................ 437/209; 437/211; 437/214; 437/217; 437/219
[58] Field of Search ..................................... 437/209, 211, 437/212, 213, 214, 215, 216, 217, 218, 219, 220, 904

[56] References Cited

U.S. PATENT DOCUMENTS

| | | | |
|---|---|---|---|
| 5,166,098 | 11/1992 | Micic et al. ............................. | 437/219 |
| 5,337,216 | 8/1994 | McIver .................................... | 437/219 |

*Primary Examiner*—Tom Thomas
*Assistant Examiner*—Kevin M. Picardas
*Attorney, Agent, or Firm*—Browdy and Neimark

[57] ABSTRACT

A method of making a semiconductor diode including the steps of: i) stamping a sheet form metal to form a conductor element having a jumper electrode and a bottom electrode, bending connecting strips between the electrodes into a corrugated configuration so that the tip of the jumper electrode is over the bottom electrode, and placing a diode chip in between the tip and the bottom electrode; ii) soldering two opposite sides of the diode chip to the jumper electrode and the bottom electrode; iii) chemically etching the diode chip by an etchant, oxidizing the diode chip by an oxidizer, and applying the diode chip with a P-N junction protecting material and drying it by heating; iv) filing a sealing resin in the chip cavity of a multi-layer substrate board and applying the substrate board with a bonding agent, and attaching diode chip and conductor element subassembly to the substrate board and bending terminal portions of the conductor element to form terminals; v) applying a layer of bonding agent over a cover lid and fastening them to the conductor element by deforming the fastening fingers, and curing the bonding agent and the sealing resin by heating and vi) testing the electric parameters of the diode units and cutting out a cathode identification cut, and cutting into individual diode units and sorting according to its specifications and packing.

12 Claims, 13 Drawing Sheets

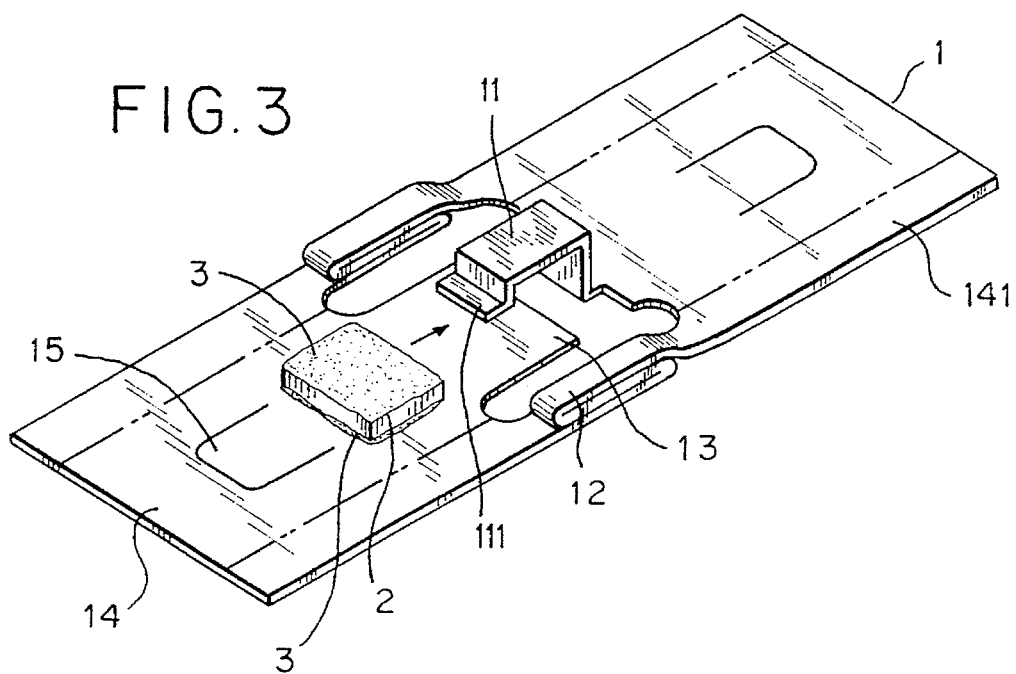
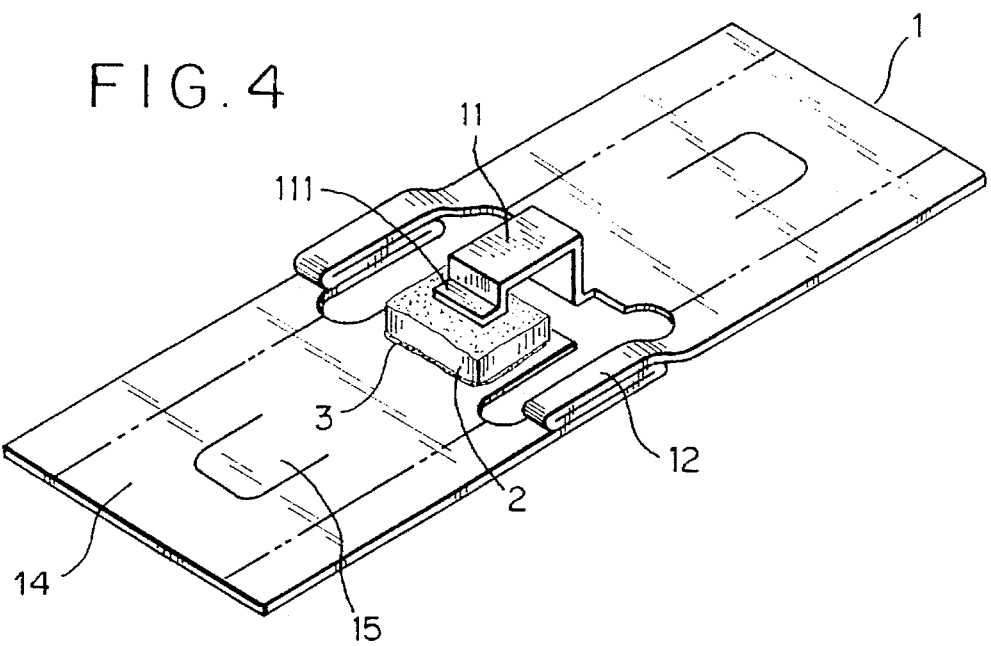

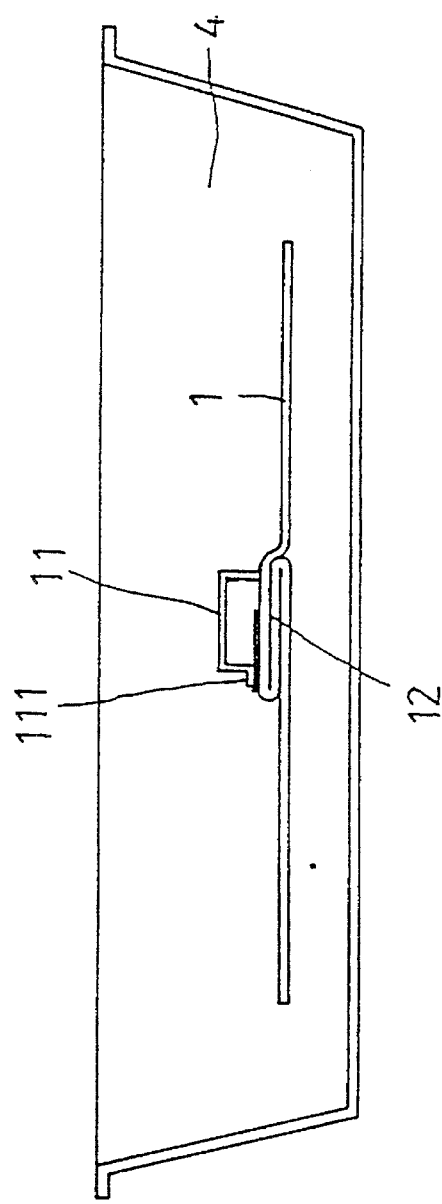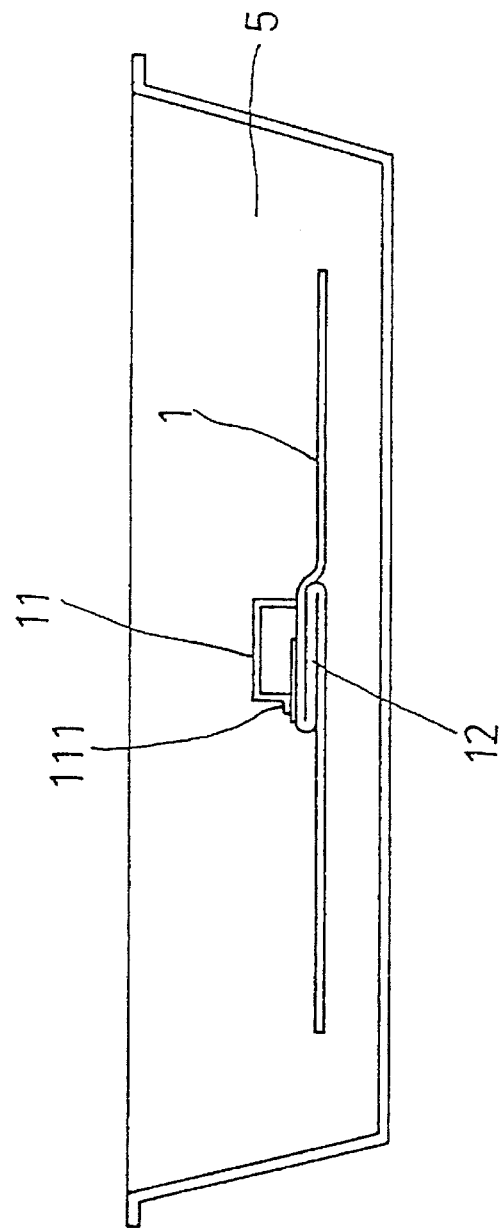

METHOD OF MAKING A SEMICONDUCTOR DIODE

BACKGROUND OF THE INVENTION

The present invention relates to the method of making a semiconductor diode, and relates to an improved and practical method for making a variety of semiconductor diodes and diode circuit modules.

PRIOR ART

In recent years, various new industrial materials, techniques and equipment have been disclosed and employed for the production of a variety of electronic components and products. However, plastic the molded axial leaded package method which was disclosed thirty years ago is still commonly used for the production of silicone rectifier diodes nowadays, because those other newly developed packing methods including SOD, MELF, etc. have drawbacks.

Since the beginning of the industrial production of silicone rectifier diodes about forty years ago, several packing methods have been disclosed and employed for the production of silicone rectifier diodes. These semiconductor diode packing methods are outlined hereinafter.

1. METAL CAN TYPE PACKAGE:

This type of semiconductor diode package is usually pre-manufactured in a two-piece kit configuration. One piece part is in headed screw like form. The other piece part is consructed by three major parts: a big tubular metal piece for diode element housing, a smaller tubular metal piece for lead wire connection and termination, and in between the two metal parts sealing glass is used to bond the two metal parts and form a hermetic seal. In the diode assembling process, a diode element with P-N junction treated and protected shall be used. The diode element is bonded one electrode to headed-screw type part. Usually bonding method is soft soldering. On the other electrode of the diode element, a connecting metal wire is soldered. Then the glass-seal part is encased by inserting the connecting metal wire into its terminal tube. The glass-seal part is electrically welded to the head-screw part. After evacuating the diode element housing, the terminal tube is clamped to a form air-tight seal. Thus the electrical connection of the connecting wire and terminal tube is formed at the same time. The major steps of the Metal Can Package of semiconductor diode are now completed. This package has been adopted by the industry since its introduction. However several packages were developed afterwards, such as Double Plug Glass-Tube Seals Package, Axial Lead Plastic Molding Package etc. These packages are more cost-effective for medium and low amperage diode types. Today the Metal Can Package is still the major industrial standard for packaging high amperage diode types.

2. GLASS TUBE TWO STEP SEALS PACKAGE:

The package materials are prepared into two-piece configuration. One piece is made from a glass tube, a glass bead and a terminal metal wire. This piece is so called First Seal. The other piece is made from a glass bead, a terminal metal wire and a C-bend form metal soldering contact welded to the tip of the terminal wire. In the diode assemblying steps, the diode element is first soldered to terminal wire tip of the first seal and the C-bend contact. Then the glass bead of the C-bend sub-assembly and the open end of the glass tube of the first seal are heated to form the second glass seal. Thus the major packing steps are completed. In normal industrial practice, the high temperature and heat result degredation of the electical parameters and properties of the junction coating of the diode element. The manufacturing cost is much higher than the Axial Lead Plastic Molded Package Method.

3. DOUBLE PLUG GLASS SEALS PACKAGE:

The packing materials of this type are pre-manufactured into three piece parts. The lead wire, usually copper clad steel or copper, is electrically welded to a piece of dumet in plug shape. The other piece part is a piece at glass tube. In the diode assembly procedures, the glass tube, two plug-headed lead wires and a diode chip are loaded in a glass sealing jig, then the loaded jig is heated in electical furnace to melt and seal the two domet plugs to the ends of the glass tube. The major packaging procedures are completed. The diode chip for this package usually has silicon dioxide or passivation glass coating over its P-N junction. This type of diode package has been very effective industrial standards for silicon small signal diodes since introduction. However, it is not suitable for power diodes due to the press-contact construction of the chip to the two dumet plugs.

4. DOUBLE PLUG GLASS SEALS WITH BRAZED JOINTS PACKAGE:

In this package, the diode chip is brazed to the two plugs. In order to make the silicon-metal-glass integrated construction through high temperature processing, usally over 700 degree centigrade, the plugs are generally made from tungsten or molybedum. Brazing joint material commonly used is aluminum or silver. The assembling procedures are similar to those of Double Plug Glass Seals Package. This package can produce diodes of high reliability, but manufacturing cost is relatively much higher than that of Axial Lead Plastic Molding Package or many other packages.

5. GLASS BEAD RECTIFIER PACKAGE:

The lead wires, molybedum plugs and diode chip subassembly, is brazed with evaporation plated aluminum films over the diode chip. The P-N junction passivation and diode body are formed simultaneously by coating a bead form passivation glass powder slurry over the molybedum-chip portion of the subassembly. The unit is then fired to form a vitrified glass bead-shaped diode encapsulation. This package provides very high level reliability performance. The minor dissatisfaction from market is the bead-shaped diode body which causes difficulties through feeding and handling mechanism of their machine. The manufacturing cost is almost as high as the Double Plug Glass Seals Package.

6. AXIAL LEAD PLASTIC MOLDING PACKAGE:

This type package utilizes thermosetting plastics for its encapsulation material. Thus the diode lead-chip subassembly can be constructed by soft solder joints. The diode chip is junction coated or not. If non-protected junction chip is used, the junction must be treated by chemical polish, wet oxidation etc, and then passivation coating. The coated subassembly is placed in a transfer mold to build a plastic body over it. This type package has been widely adopted by the industry since its introduction in early sixties. It is the most economic method to produce lead-mount diode in large quantities. Yet its structure and process result lower levels of performance and reliability comparing to other types.

7. GLASS BEAD WITH PLASTIC MOLDING PACKAGE:

This is a hybrid type design of Glass Bead Rectifier Package and Plastic Molding Package. A plastic body is molded over a miniature glass bead rectifier. It provides similar high performance and reliability to glass bead rectifier, yet manufacturing cost is greatly reduced. The outline is in shape easier to handle then the bead-shape.

8. MELF PACKAGE:

The MELF package is a leadless configuration of glass or plastic lead-mount type diodes. It is for surface mounting printed circuit board application. The cylindric outline is difficult to keep in proper position during PCB assembly operations.

9. SOD PACKAGE:

The SOD, small outline diode package is a derivation from SOT, small outline transistor. Its manufacturing reguires highly precise piece parts, tools and molds. Thus it results high costs.

SUMMARY OF THE INVENTION

The basic inventional concept of this case is the laminal construction. All the packaging materials are prepared in sheet form including conducting part, insulation diode body and bonding prepreg. The diode chip can be either P-N junction protected or as-cut without junction protection. In case of non-protected chip, the chip is prepared by junction treatment of etching, oxidation etc. The conducting part is made from metal sheet. It includes a chip bonding pad, a conducting lead and outside-body terminal of one electrode, a chip bonding jumper lead and a outside-body terminal of another electrode, and rib-form connection part for the two electrodes. The main insulation body part is made from sheet form insulation material such as fiberglass reinforced plastic, ceramic etc. The body part has a cavity to adopt the chip and jumper lead. The body part is prepared by adhering two sheets, one with a cavity hole in it. Another part of body is a cover lid. The diode chip is first bonded to a conduction part by high lead contained solder alloy. Where a non-protected chip is used, the solder subassembly is clean-etched and treated. The cavity of the main insulation body part is filled with P-N junction protection type resin. An adhesive applied pre-preg sheet is attached to the main insulation body part. The chip is mounted to the conduction part. A second layer of adhesive is applied to the pre-preg sheet. Then the cover lid is attached. The out-side body terminals are formed and all sheet layers are clamped by the clamping fingers of the terminals or by the wrapped around terminals. The assembly is heat treated to cure the P-N junction protection resin and adhesives. The packaging completed diode is further finished by terminal solder dipping, electrical test, marking, separation cutting, binning and packing to industrial specifications.

Advantages of the invention are:
1) Good mechanical strength.
2) Good electrical conductance.
3) Good heat dissipation. Enhanced heat dissipation can be achieved by providing heat sink fins on the main insulation body part with a little additional cost.
4) Good hermetic seal.
5) Minimize the use of jigs, tools and molds, which are widly used in regular diode assemling procedures. The assembly cost is thus reduced.
6) Material cost is low.
7) Manufacturing efficiency is higher than that of regular packages through the multi-units piece parts and lamination design.
8) Full box type outline enables solderable in either side.

BRIEF DESCRIPTION OF THE DRAWINGS

FIG. 3 shows the conductor element of FIG. 2 bent and the jumper electrode moved into position;

FIG. 4 shows a diode chip soldered to the jumper electrode and bottom electrode of the conductor element of FIG. 3;

FIG. 5 shows the conductor element and diode chip sub-assembly of FIG. 4 processed by an etchant;

FIG. 6 shows the conductor element and diode chip subassembly of FIG. 5 treated by oxidizer;

DETAILED DESCRIPTION OF THE PREFERRED EMBODIMENT

Figure 1:
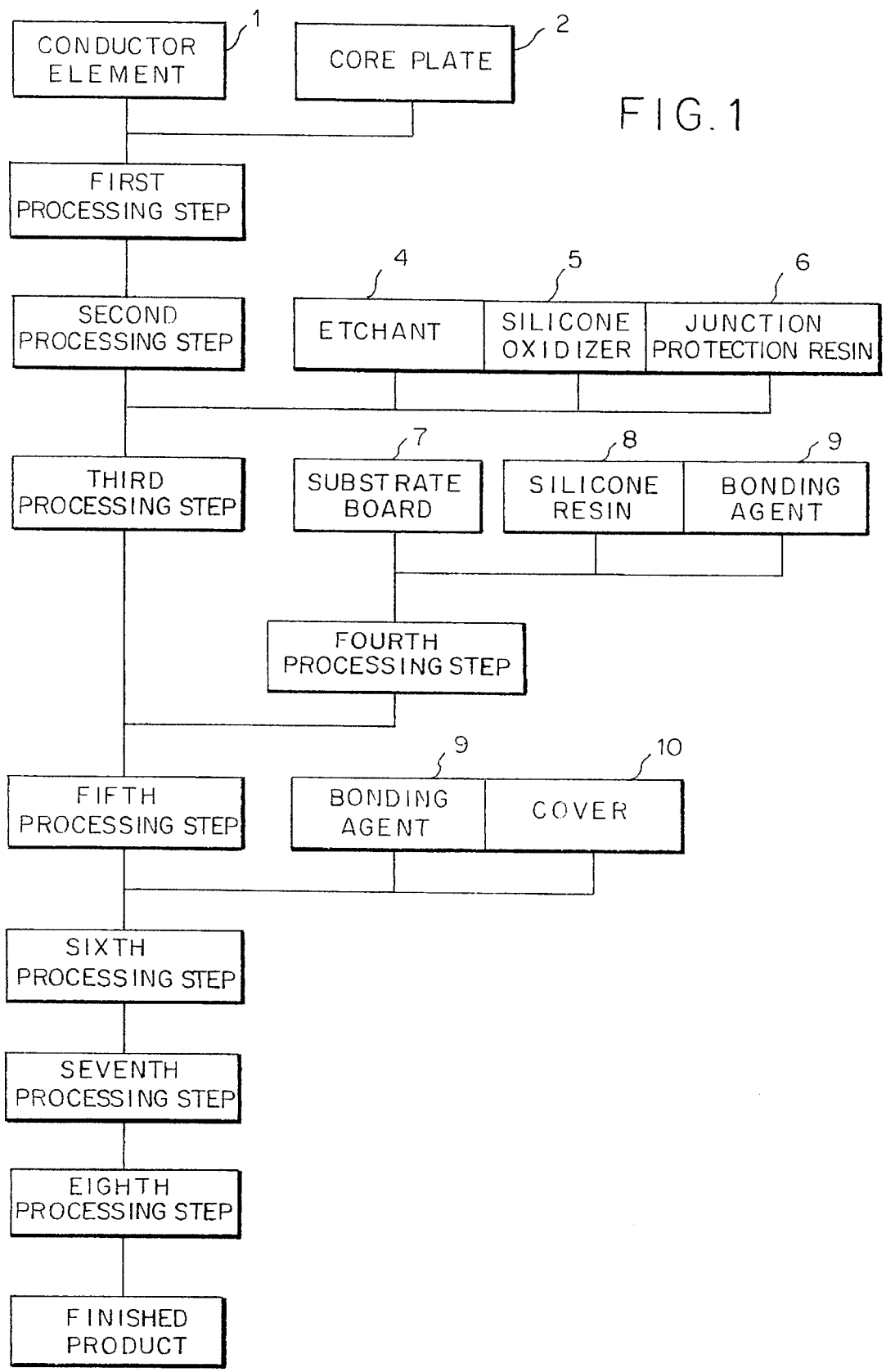
FIG. 1 is a flow chart showing the method of making a semiconductor diode according to the present invention.

Referring to FIG. 1, process flow according to the present invention includes eight processing steps, which are outlined hereinafter.

Figure 2:
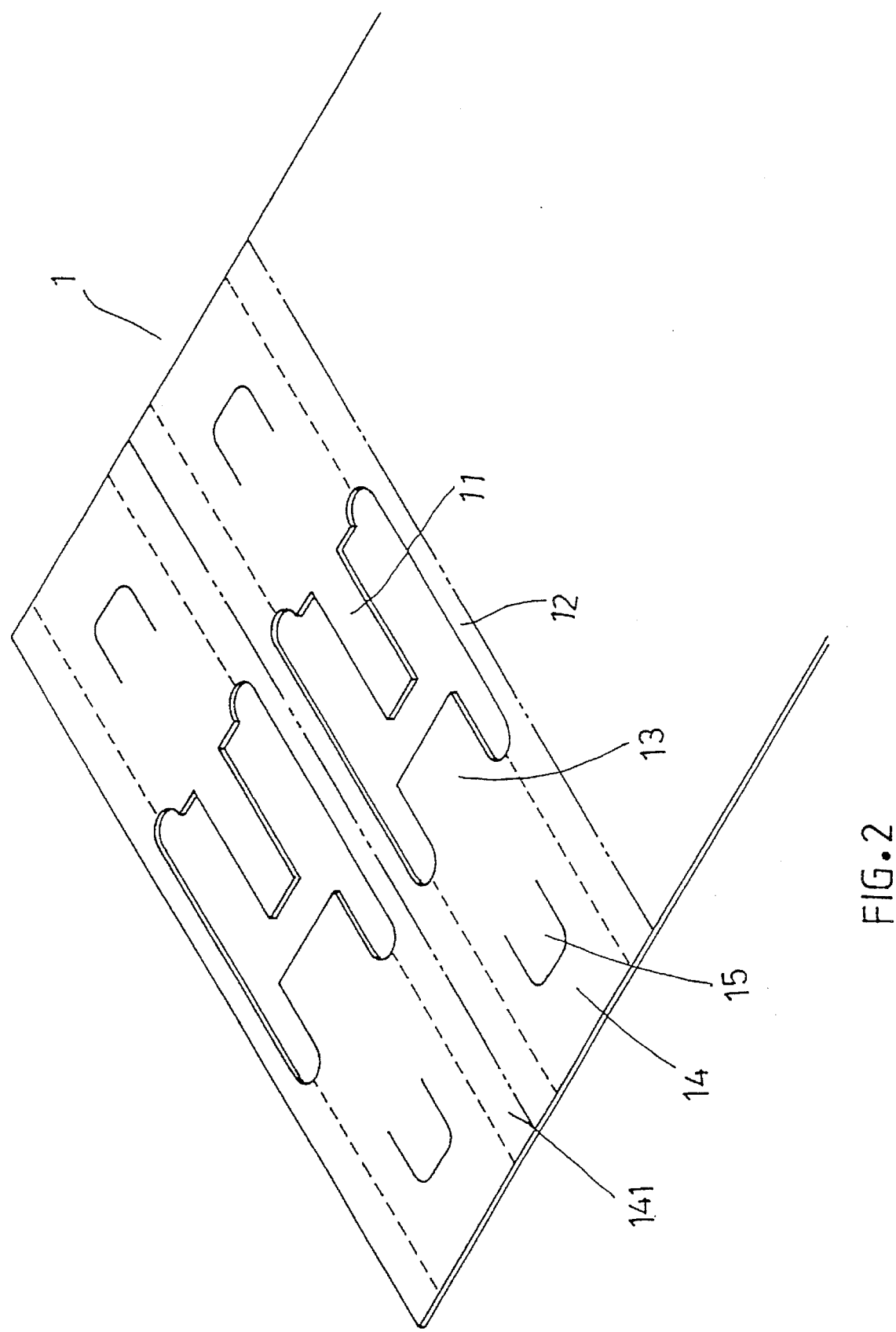
FIG. 2 shows a flat conductor element stamped according to the present invention.
Figure 7:
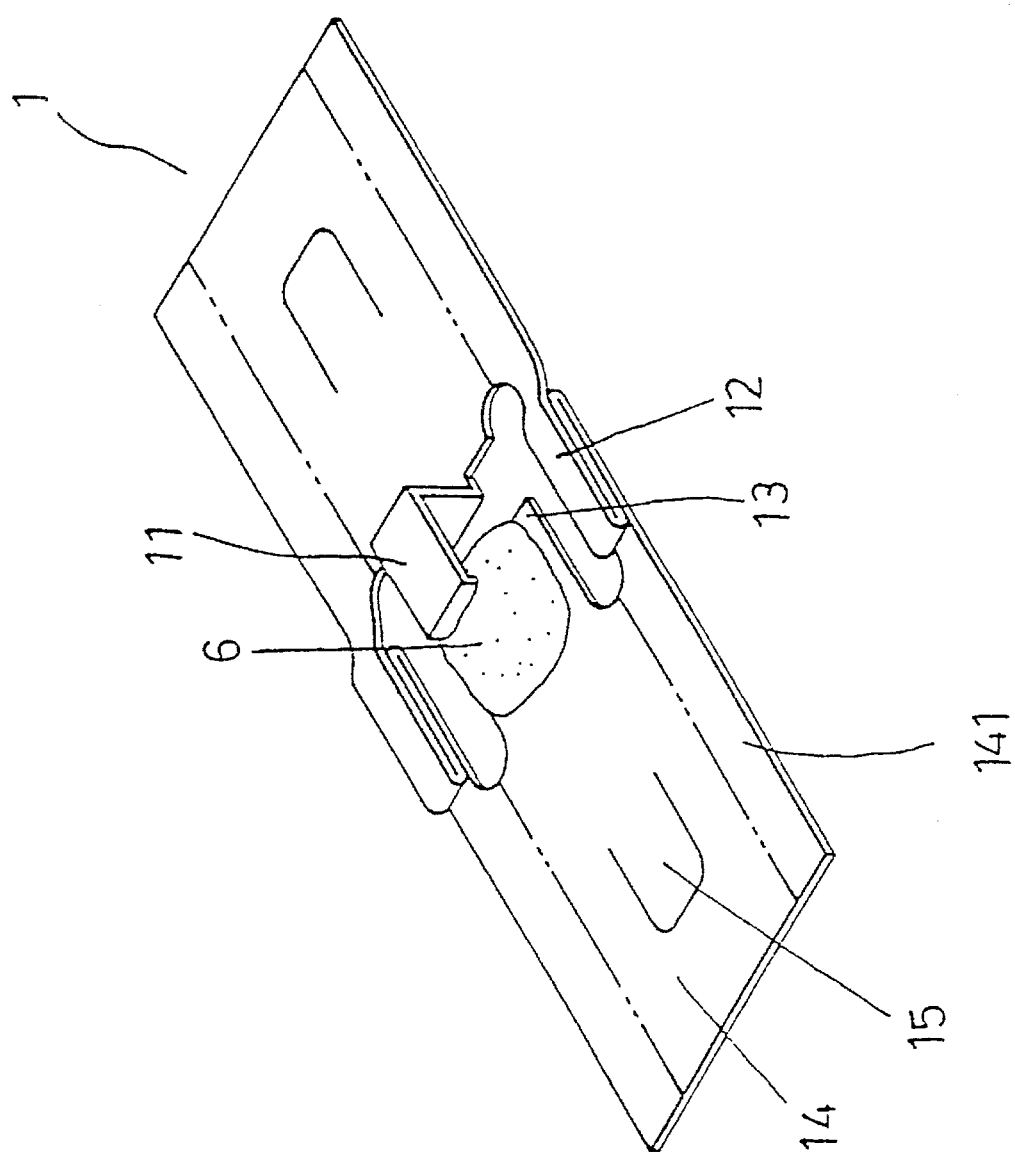
FIG. 7 shows the diode chip of FIG. 6 covered with P-N junction coating resin.

THE FIRST PROCESSING STEP (see FIGS. 2, 3, and 4):

Conductor part 1 is stamped to form jumper electrode 11 and bottom electrode 13, then connecting strips between jumper electrode 11 and bottom electrode 13 are bent to form vertically corrugated connecting configuration 12, permitting soldering tip 111 of jumper electrode 11 to be moved and located above bottom electrode 13. Then, diode chip 2 is guided in between soldering tip 111 and bottom electrode 13 and held down by soldering tip 111 of jumper electrode 11.

THE SECOND PROCESSING STEP (see FIGS. 3 and 4):

Tin solders 3 which are pre-soldered to diode chip 2 are re-melted to connect soldering tip 111 of jumper electrode 11 and bottom electrode 13 to each side of diode chip 2.

THE THIRD PROCESSING STEP (see FIGS. 4, 5, 6, and 7):

The diode chip 2 is chemically etched by etchant 4, then oxidized it by oxidizer 5. After rinse and drying, P-N junction protection material 6 is applied over diode chip 2 and cured by heating (this step can be omitted if a pre-protected diode chip is used).

Figure 8:
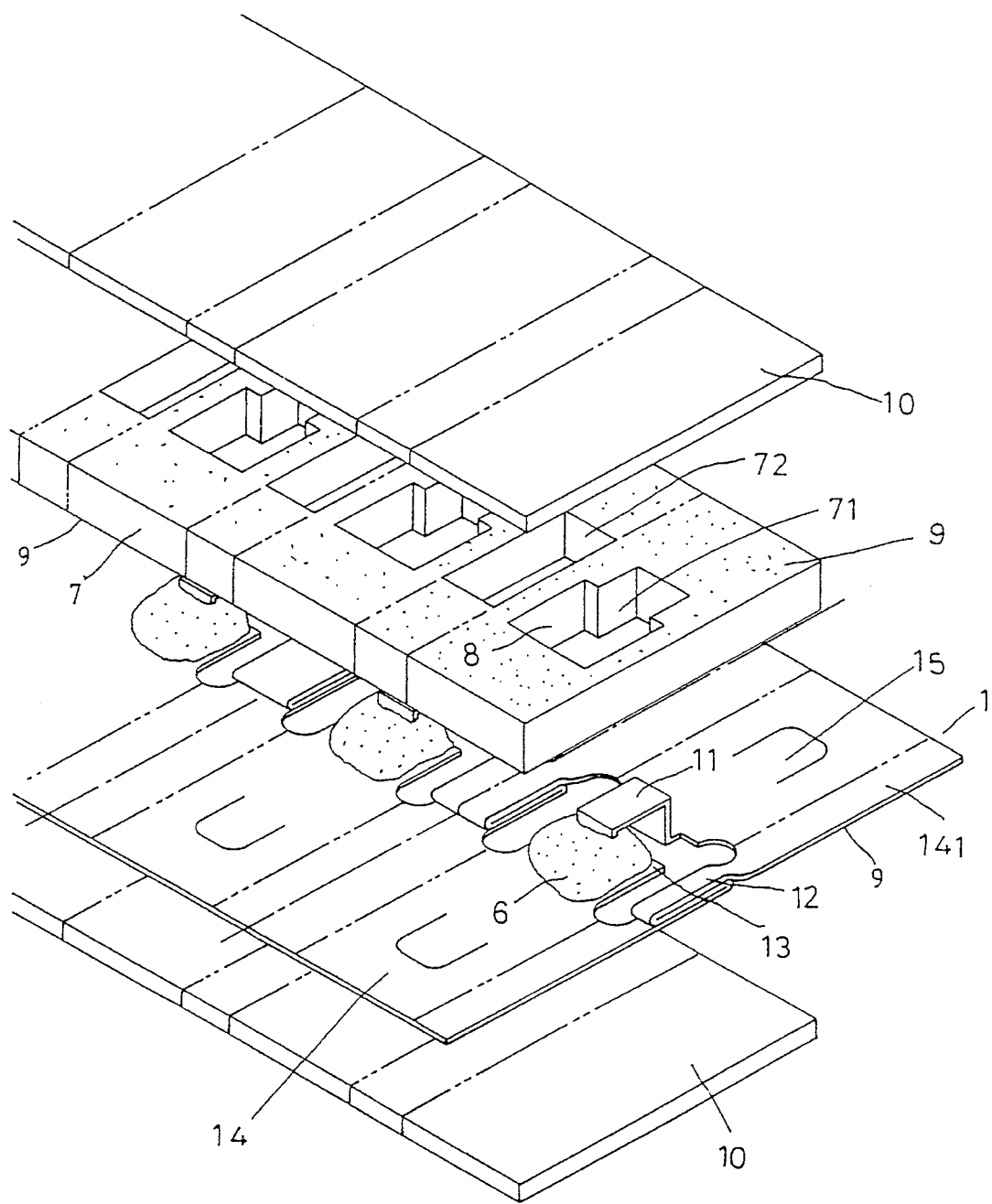
FIG. 8 shows the an exploded view of the parts comprising the present invention.

THE FOURTH PROCESSING STEP (see FIG. 8):

Sealing resin is filled in chip cavity 71 on multi-layer substrate board 7 and bonding agent 9 is applied over the surface of substrate board 7.

Figure 9:
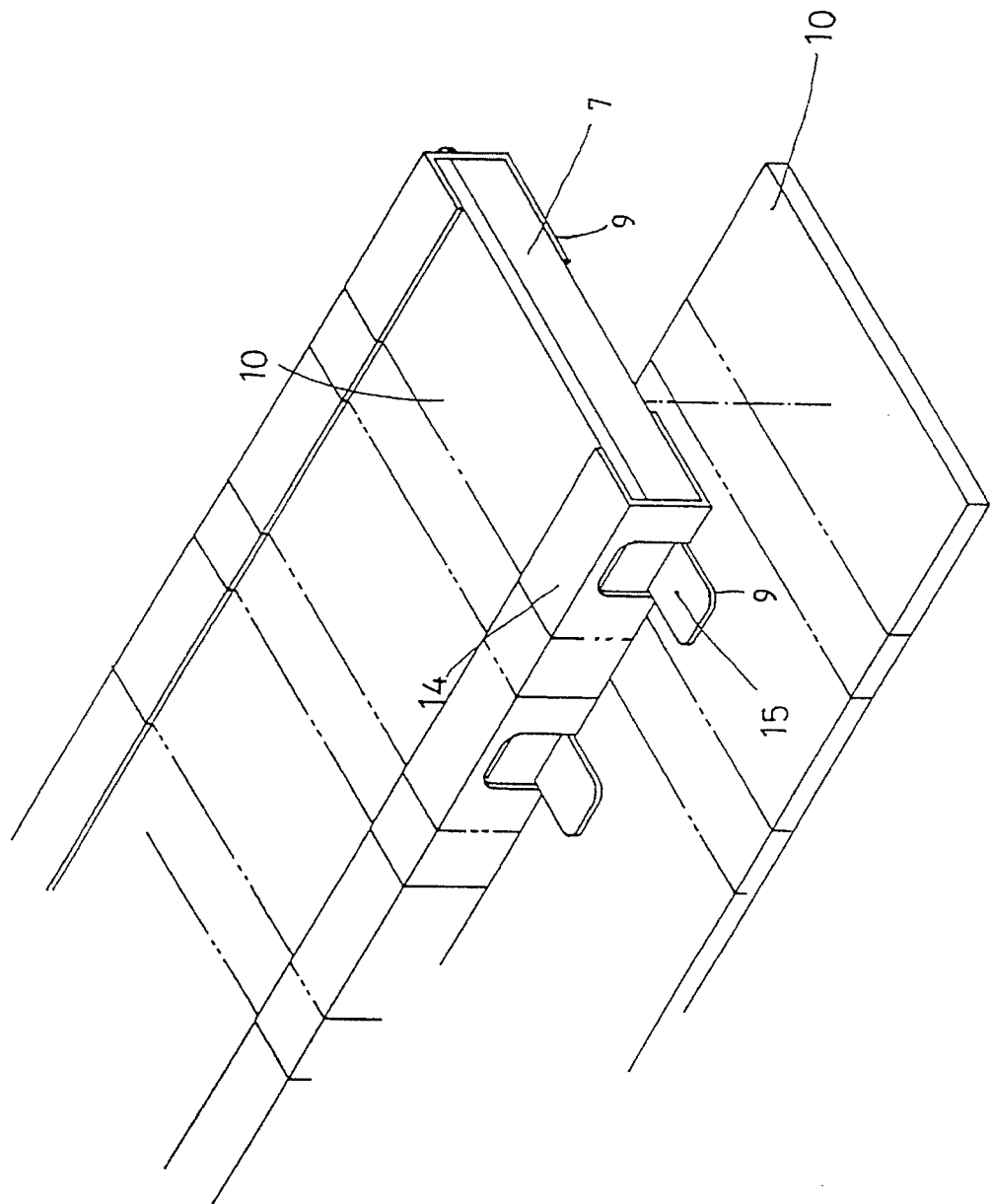
FIG. 9 shows the main insulation body part mounted to the subassembly and the cover lid to be attached.
Figure 10:
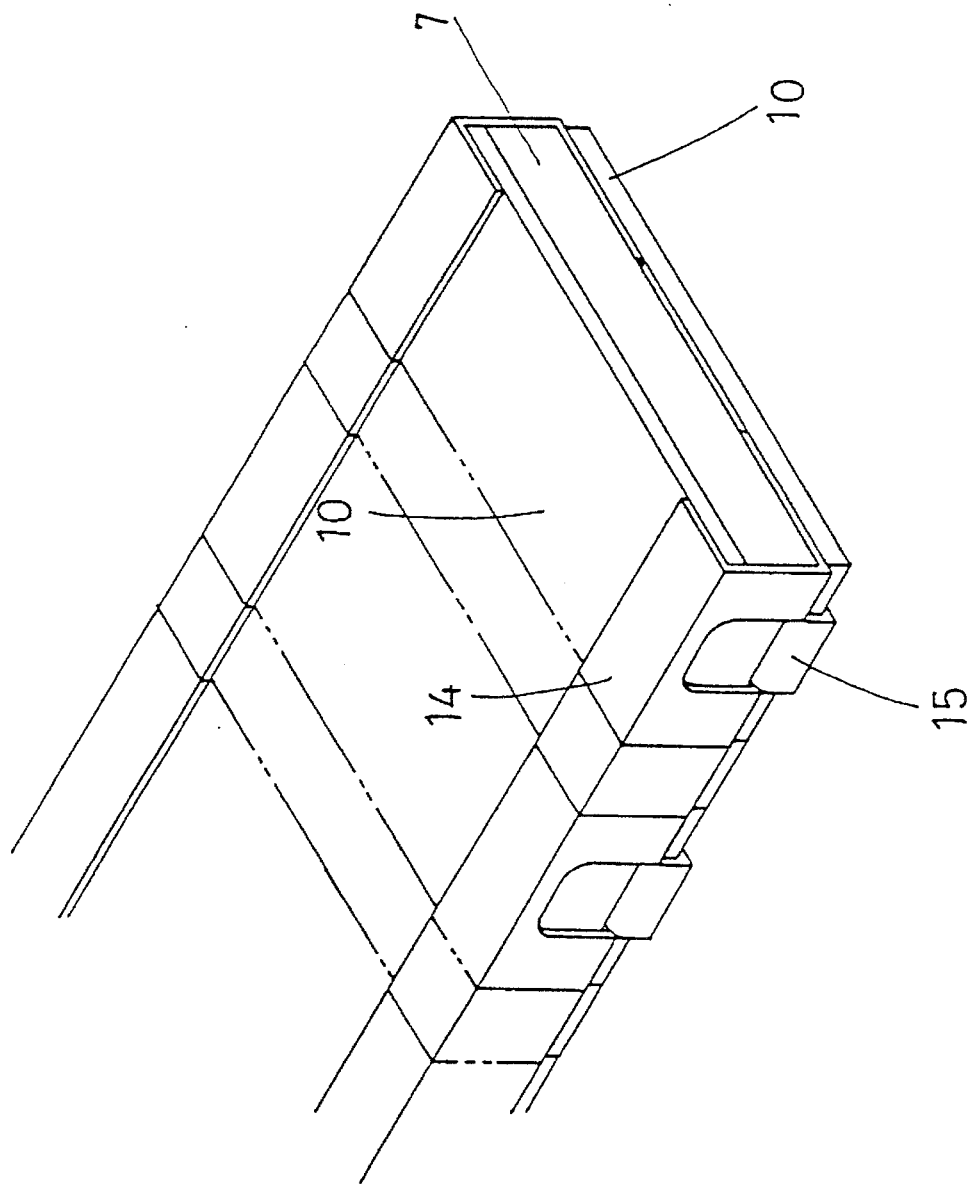
FIG. 10 shows the assembled finished units, in connected configuration.
Figure 11:
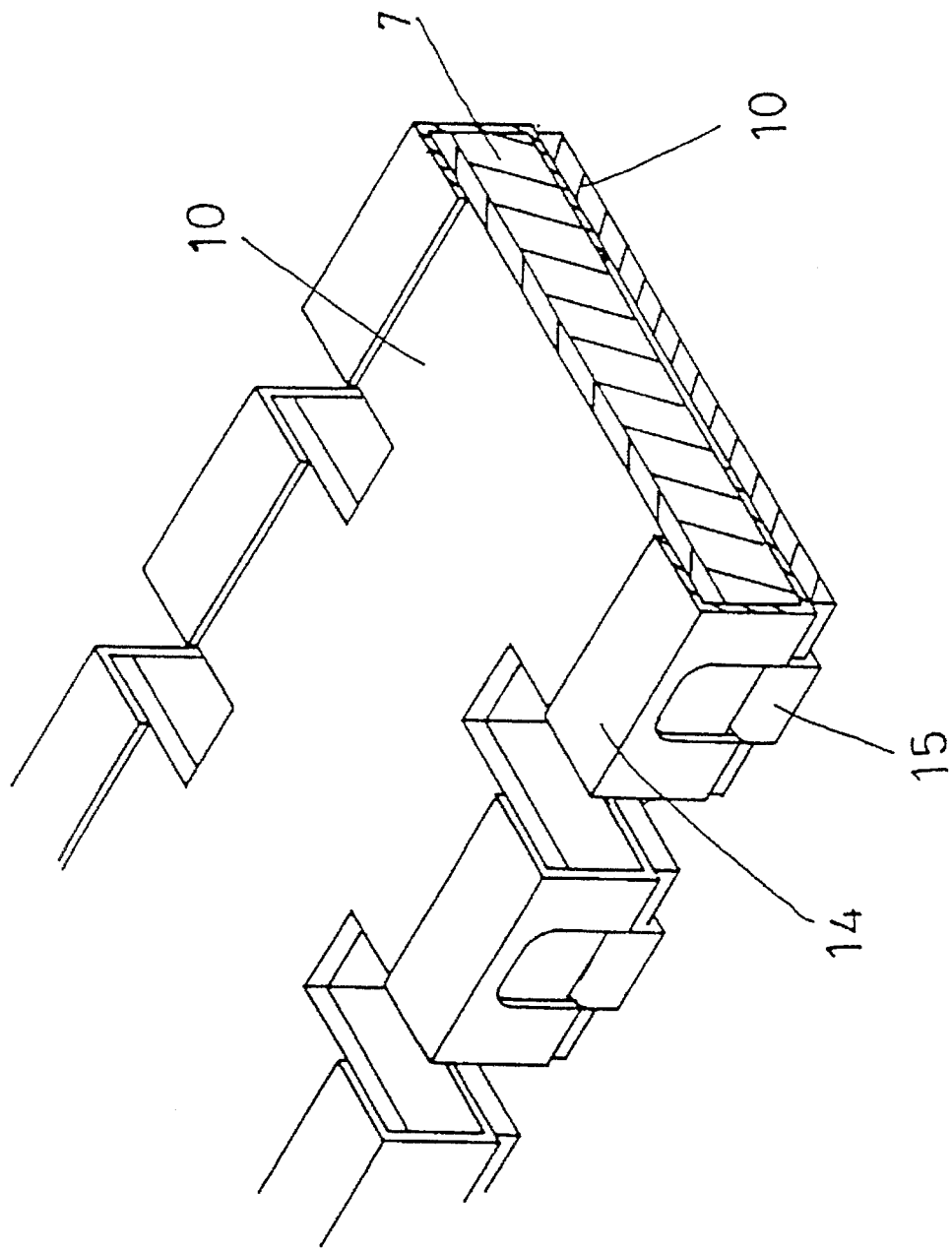
FIG. 11 shows the terminals of FIG. 10 properly cut.

THE FIFTH PROCESSING STEP (see FIGS. 8 and 9):

The subassembly 1, 2 and 3 is engaged to substrate board 7 with diode chip 2 inserted into chip cavity 71, then conductor element 1 is bent to form terminals 14.

THE SIXTH PROCESSING STEP (see FIGS. 8, 9, 10, 11, 13):

A layer of bonding agent 9 is applied over cover lid 10, then cover lid 10 is fastened to substrate board 7, then fastening fingers 15 of conductor element 1 are bent to hold cover lid 10 firmly to substrate board 7.

THE SEVENTH PROCESSING STEP:

The assembly thus obtained from the aforesaid sixth processing step is put in an electric oven and bonding agent 9 and sealing resin 8 are cured by heating.

Figure 12:
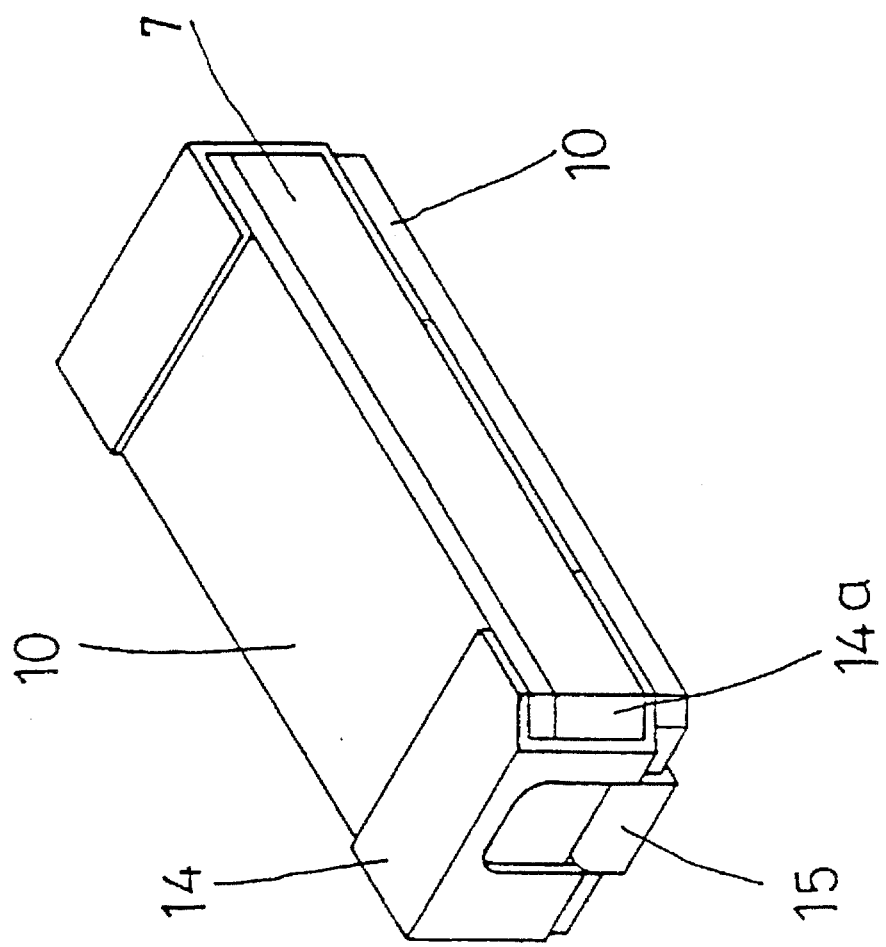
FIG. 12 shows a finished unit of the present invention.
Figure 13:
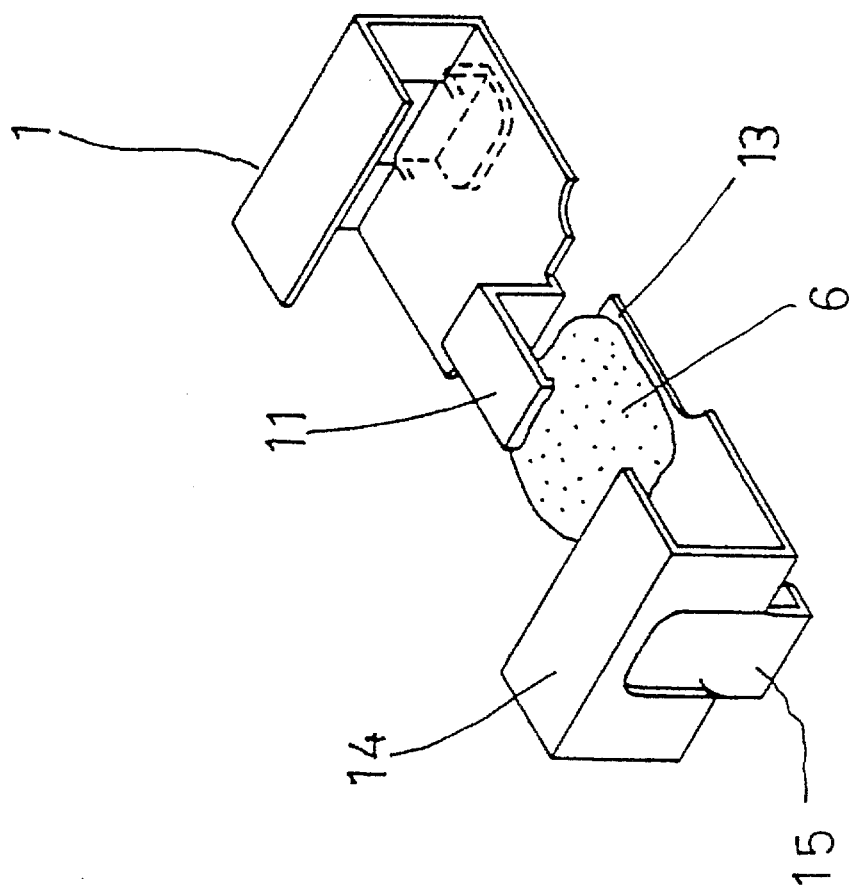
FIG. 13 is the terminal-lead-chip construction of the present invention.

THE EIGHTH PROCESSING STEP (see FIGS. 1 and 12):

The connecting portion 141 between the two terminals 14 (see FIG. 2) are cut off, then the electric parameters of individual units 14 are tested by an electric parameter test apparatus and the test results are memorized, then the cathode identification cut 14a is cut out according to the test results, and then the individual units are separated from one another by cutting (see FIGS. 1 and 12), and then the units thus obtained are classified according to the memory signals of the test results, and the PRIME BIN units are packed by an automatic packing machine.

Figure 14:
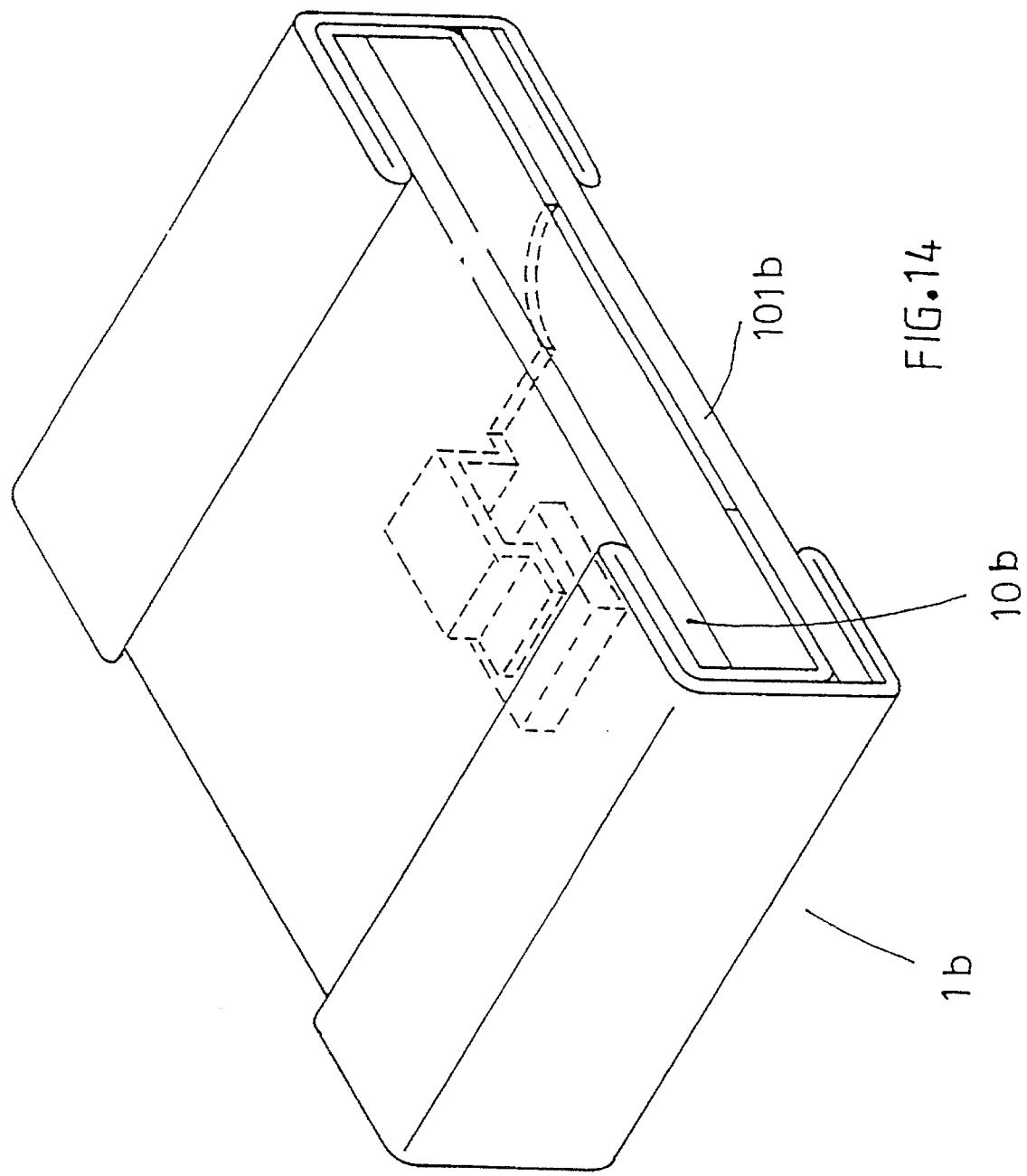
FIG. 14 shows an alternate form of the terminal type according to the present invention.

FIG. 14 shows an alternate form of the terminal type of the present invention. As illustrated, conductor element 1b has both ends respectively bent and covered over top cover 20b and bottom cover lid 101b respectively to form wrapped around type terminals.

Figure 15:
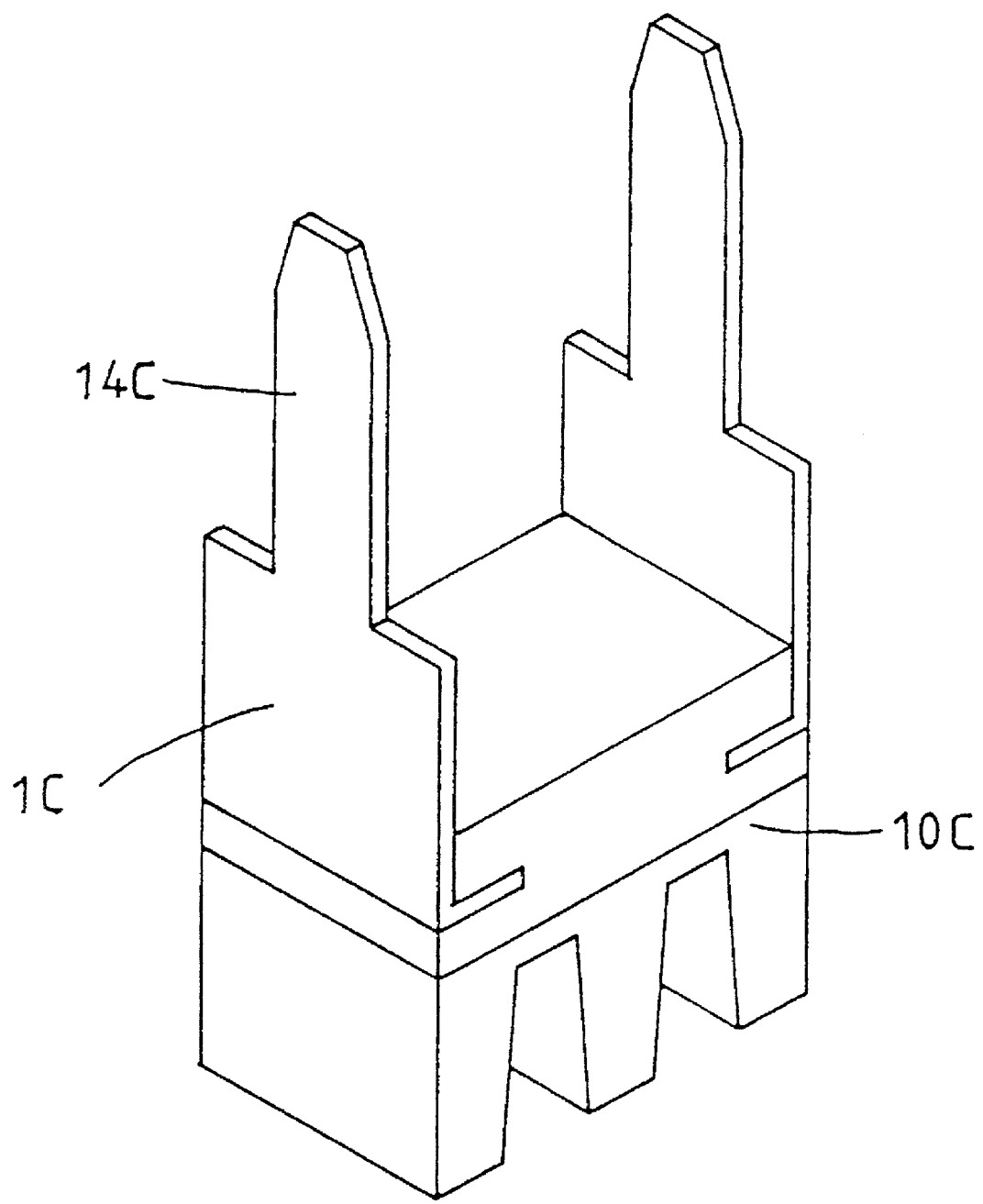
FIG. 15 shows an alternate outline of the present invention.

Referring to FIG. 15, conductor element 1c is made in the form of insertion pin type terminals 14 with the head thereof bent at right angles; cover lid 10c is made with heat sink fins.

The aforesaid substrate board 7 is made from glass fiber reinforced resin, having chip cavity 71 for adoption of diode chip 1 and jumper electrode 11. The diode chip 1 can be any type rectifier diodes, signal switching diodes, zener diodes, etc., (see FIGS. 4 and 8).

As indicated, the present invention may be variously embodied. Recognizing that various modifications and changes are apparent, the scope herein shall be deemed as defined in the claims set forth hereinafter.

What is claimed is:

1. A method of making a semiconductor diode comprising the steps of:
   i) stamping a sheet form metal to form a jumper electrode having a soldering tip, a bottom electrode and connecting strips between said jumper electrode and said bottom electrode, then bending said connecting sections to move the soldering tip of said jumper electrode above said bottom electrode, and then placing a diode chip in between said soldering tip and said bottom electrode;
   ii) melting pre-attached solders on said diode chip to bond said chip to said soldering tip of said jumper electrode as well as said bottom electrode to form electrical connections;
   iii) chemically etching said diode chip by an etchant, then oxidizing said diode chip by an oxidizer, and then protecting said diode chip with a P-N junction protection material and curing it by heating;
   iv) filling a sealing resin in the diode chip cavity of a multi-layer substrate board and then applying the surface of said substrate board with a bonding agent, then placing said sub-assembly of diode chip and conductor element on said substrate board with said jumper electrode inserted into said diode chip cavity, and then bending said conductor element to form two opposite terminals;
   v) applying a layer of bonding agent over said cover lid, then fastening said cover lid to said conductor element, by bending up the fastening fingers of said conductor element to let said cover lid by firmly retained to said conductor element, and then curing said boding agent and said sealing resin by heating in an electric heating oven; and
   vi) testing the electric parameters of said diode units by an electric parameter testing apparatus and cutting a positive pole identification cut, and then separating individual diode units thus made and packing them individually by an automatic packing machine.

2. The method of making a semiconductor diode of claim 1 wherein said substrate board, said conductor element and said cover lid are bonded by said bonding agent to form the body of a semiconductor diode in a laminated structure.

3. The method of making a semiconductor diode of claim 1 wherein said substrate board is made with a chip cavity for adopting a respective diode chip and jumper terminal portions.

4. The method of making a semiconductor diode of claim 1 wherein said diode chip can be any type for rectifier, signal switching diodes, zener diodes, etc.

5. The method of making a semiconductor diode of claim 1 wherein said sealing resin is filled in each chip cavity on said substrate board for protecting said diode chip.

6. The method of making a semiconductor diode of claim 1 wherein said jumper electrode, said bottom electrode, said terminals, said connecting strips, and fastening fingers are parts of said conductor element.

7. The method of making a semiconductor diode of claim 1 wherein said soldering tip of said jumper electrode is moved to the top of said bottom electrode by folding he connecting strips between said jumper electrode and said bottom electrode into vertically corrugated configuration.

8. The method of making a semiconductor diode of claim 1 wherein said connecting strips which connect said jumper electrode and said bottom electrode are respectively laid-out at a cut-off strip area between two respective diode units.

9. The method of making a semiconductor diode of claim 1 wherein said conductor element has two respective terminal portions and a respective fastening finger in each terminal portion, said terminal portions and said fastening fingers being deformed to fasten said substrate board and said cover lid to said conductor element.

10. The method of making a semiconductor diode of claim 1 wherein said conductor element having two terminal portions formed to wrap around each end of said laminated diode body.

11. The method of making a semiconductor diode of claim 1 wherein said conductor element is formed to have insertion pin type terminals.

12. The method of making a semiconductor diode of claim 1 wherein said cover lid is made with heat sink fins thereon.

* * * * *